United States Patent
Neumann et al.

(10) Patent No.: US 7,359,469 B2
(45) Date of Patent: Apr. 15, 2008

(54) SIGNAL DELAYING DEVICE AND METHOD FOR DYNAMIC DELAYING OF A DIGITALLY SAMPLED SIGNAL

(75) Inventors: Stephan Neumann, Munich (DE); Kurt Schmidt, Grafing (DE); Markus Freidhof, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 745 days.

(21) Appl. No.: 10/761,136

(22) Filed: Jan. 20, 2004

(65) Prior Publication Data

US 2004/0202265 A1   Oct. 14, 2004

(30) Foreign Application Priority Data

Jan. 28, 2003   (DE)   ................ 103 03 248

(51) Int. Cl.
*H04L 7/00* (2006.01)
(52) U.S. Cl. ................ 375/355; 375/354
(58) Field of Classification Search ............. 704/265; 708/290, 313; 375/355, 316, 354
See application file for complete search history.

(56) References Cited

U.S. PATENT DOCUMENTS

| | | | | |
|---|---|---|---|---|
| 4,528,565 A | * | 7/1985 | Hauptmann | .......... 342/91 |
| 5,280,352 A | * | 1/1994 | Herrmann | .......... 348/571 |
| 5,329,614 A | * | 7/1994 | Kidd et al. | .......... 345/671 |
| 2002/0133524 A1 | * | 9/2002 | Schmidt | .......... 708/313 |
| 2003/0142734 A1 | * | 7/2003 | Black et al. | .......... 375/149 |
| 2003/0204542 A1 | * | 10/2003 | Mueller | .......... 708/290 |

FOREIGN PATENT DOCUMENTS

DE   690 22757 T2   3/1996

* cited by examiner

*Primary Examiner*—Chieh M. Fan
*Assistant Examiner*—Jason M. Perilla
(74) *Attorney, Agent, or Firm*—Christensen O'Connor Johnson Kindness PLLC

(57) ABSTRACT

A signal delaying device (1) for the dynamic delaying of a digitally sampled input signal comprises a memory element (2) and a series-connected interpolation element (3). According to the invention, a register (30), which can be connected to the output side of the interpolation element (3), is arranged in parallel to the memory element (2) for intermediate storage of at least one sampled value ($S_{in}(k)$) of the input signal.

11 Claims, 8 Drawing Sheets

SIGNAL DELAYING DEVICE AND METHOD FOR DYNAMIC DELAYING OF A DIGITALLY SAMPLED SIGNAL

The invention relates to a signal delaying device and a method for dynamic delaying of a digitally sampled signal.

For instance, in the context of signal generators, which generate mobile telephone signals, there is a need for a dynamic delay of the signals present in digital form in the base band, for example, in order to simulate dynamic fading. Dynamic fading is a typical channel property of mobile telephone transmission routes, in which the shading and reflection conditions of the mobile telephone device moving spatially over the transmission route are constantly changing. In signal generators used in mobile telephone measuring technology, this dynamic signal delay must therefore be simulated in the base band conditioning. In this context, dynamic delaying means that the time delay experienced by the signal is not constant but changes dynamically. The signal generator therefore provides a signal delaying device in the base band, which forms the subject matter of the present invention. The base-band conditioning and the arrangement of the signal delaying device according to the invention may, for example, be found as a whole in document DE 101 24 372 A1, where the signal delaying device is described as a fading unit (Fad A, Fad B).

If only a static delay is to be provided in the signal delaying device, this is not problematic. An accurately delayed sampled value is produced with a constant delay for every sampled value of the input signal. If this is adequate in terms of accuracy, it is sufficient, to write the sampled values of the input signal into a cyclical memory, for example, into a RAM (Random Access Memory), and to read them out with a cyclical delay. A cyclical memory arrangement of this kind for a fading simulator is known, for example, from DE 101 08 922 A1. To increase accuracy, an interpolation element, which interpolates either in a linear manner, or more generally with a higher-order function between two output sampled values of the cyclical memory, can be connected in series to the cyclical memory.

A problem occurs, if the delay is not static, i.e., constant, but dynamic or variable over time. If the additional delay relative to the output sampled value of the cyclical memory caused by the interpolation increases over time, this means that, in a region defined by two successive sampled values read out from the memory, not only one intermediate value, but two intermediate values must be interpolated. An over-range of this kind does not in itself present an actual problem. While a new value is being written into the memory, no new value is read out from the memory, so that the interpolation element then once again carries out an interpolation with the same sampled values, but with different interpolation coefficients, which correspond to the new, second interpolation position.

However, an actual problem arises, if the additional delay caused by the interpolation decreases over time and therefore no interpolation value falls into a range between two successive output sampled values of the memory, and instead, the next interpolation value already falls into the next range between the next two adjacent output sampled values of the memory. This is problematic because in this case, two output values would have to be read out from the memory at the same time. This is not possible in the case of conventional memories with one read gate and one write gate. More complex memories with one write gate and two read gates are indeed available; however, these memories are considerably more expensive and would significantly increase costs. Even the solution proposed in DE 101 08 922 A1 with read fifo-memories connected in series to the memory would considerably increase costs.

The present invention is therefore based upon the object of providing a signal delaying device and a method for delaying a digital signal, which allows dynamic signal delaying at a low implementation cost even in the event of an over-range or an under-range.

This object is achieved, with reference to the signal delaying device, by the features of claim 1; and with reference to the method, by the features of claim 6.

The invention is based upon the knowledge that instead of a cost-intensive increase of access to the memory element, it is advantageous to provide the additional sampled value required in the case of an under-range, in a register arranged in parallel to the memory element. If the lower range threshold is reached, the register with the additional sampled value is loaded and can be read out, whenever the appropriate sampled value has arrived at the output of the memory element.

The dependent claims relate to advantageous further embodiments of the invention.

After a sampled value has been stored in the register, the next sampled value, which is again supplied to the memory element, is advantageously marked, for example, by a bit of the word width of the memory element, which has not been defined by the data width. Whenever the marked sampled value reaches the output of the memory element, this can be recognised by the marking, and this marked sampled value can be read out from the memory element, and also the additional sampled value from the register can be supplied to the interpolation element, so that the next interpolation is not implemented in the next range but in the next range but one. However, marking of this kind is not compulsory for the realisation of the invention. Because the runtime through the memory element is essentially known, it would be possible to register by means of a procedure control—which would generally require greater complexity—, when the sampled value immediately following the sampled value stored in the register has arrived at the output of the memory element. The runtime through the memory results from the unconditioned delay desired, it does not depend upon the memory capacity.

The interpolation element advantageously consists of a polyphase filter, to which a half-band filter is connected in series in order to reduce costs.

The invention will be described in greater detail below with reference to the drawings. The drawings are as follows.

Figure 1A:
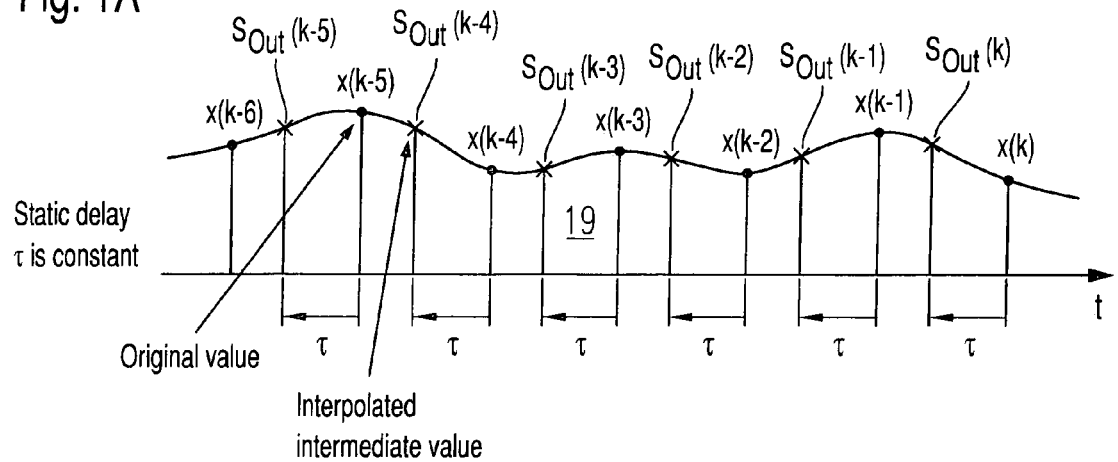
FIG. 1A shows a time line for the visualisation of a static delay.

The essential structure of the signal delaying device 1 will be described with reference to FIG. 2, after which the problem upon which the present invention is based will be explained with reference to FIGS. 1A to 1C.

A digitally sampled input signal $S_{in}(k)$ is supplied to a memory element 2. The input signal $S_{in}(k)$ is stored in a cyclical manner in the memory element 2. To a certain extent, the memory element produces an unconditioned delay. After this unconditioned delay, the corresponding sampled value is read out from the memory element 2 and supplied to an interpolation element 3, which, in the exemplary embodiment illustrated, consists of a half-band filter 4 connected in series to the memory element 2 and a polyphase filter 5 connected in series to the half-band filter 4.

In the exemplary embodiment illustrated, the polyphase filter 5 consists of a first delaying element $6_1$, a second delaying element $6_2$ and a third delaying element $6_3$, a first multiplexer $7_1$, a second multiplexer $7_2$, a third multiplexer $7_3$, a fourth multiplexer $7_4$ a fifth multiplexer $7_5$. While the fifth multiplexer $7_5$ has a special function to be described below, the first multiplexer $7_1$ is used for switching between the input of the first delaying element $6_1$ and the input of the second delaying element $6_2$. The second multiplexer $7_2$ is used for switching between the input of the second delaying element $6_2$ and the output of the first delaying element $6_1$ and/or the input of the third delaying element $6_3$ connected in series to the first delaying element $6_1$. The third multiplexer $7_3$ is used for switching between the input of the third delaying element $6_3$ and the output of the second delaying element $6_2$. By contrast, the fourth multiplexer $7_4$ is used for switching between the output of the second delaying element $6_2$ and the output of the third delaying element $6_3$.

The outputs of the multiplexers $7_1$ to $7_4$ are connected to multipliers $8_1$ to $8_4$. Moreover, each of the multipliers $8_1$ to $8_4$ is connected to a coefficient memory $9_1$ to $9_4$, in which several readable multiplication coefficients $I_0$ to $I_3$ are stored. After the less significant bits of the output signals from the multipliers $8_1$ to $8_4$ have been cut off, these output signals are supplied in pairs to a first addition element $10_1$ and a second addition element $10_2$, while the outputs of the addition elements $10_1$ and $10_2$ are again summated in the third addition element $10_3$ to form a complete signal. After rounding in a rounding element 11, the output signal $S_{out}(k)$ is provided as an interpolated sampled value.

Figure 8:
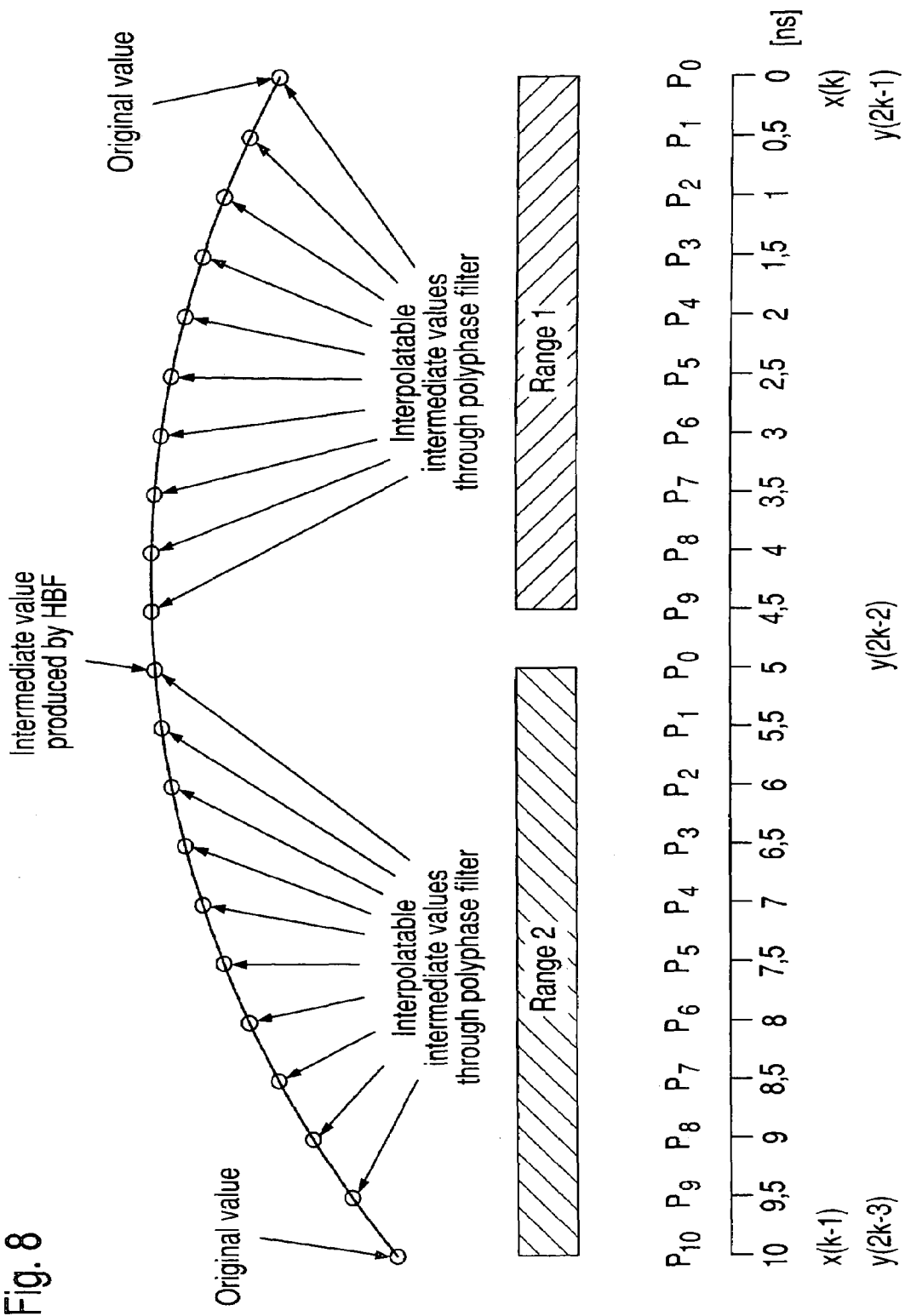

The essential method of operation of the interpolation element 3 will now be explained with reference to FIG. 8. Two output sampled values $x(k-1)$ and $x(k)$ of the memory element 2, described as "original values", are illustrated at the left and right-hand edge of the diagram. In addition to these "original values", the half-band filter 4 interpolates an intermediate value disposed exactly in the centre with reference to time. FIG. 8 shows the three output values $y(2k-3)$, $y(2k-2)$ and $y(2k-1)$ of a half-band filter 4. At 10 equidistant polyphases $p_0$ to $p_9$, the polyphase filter 5 shown in the exemplary embodiment interpolates between the output values produced by the half-band filter 4. The decision regarding at which of the ten different polyphases $p_0$ to $p_9$ the interpolation is carried out, depends on the coefficients read out from the coefficient memories $9_1$ to $9_4$. The desired polyphase is adjusted via the address "Read Control" in FIG. 2. Since the uneven output values $y(2k-1)$ and the even output values $y(k2)$ are output from the half-band filter 4 separately, and supplied to separate delaying chains, it is possible to switch between the ranges "range 1" and "range 2", as shown in FIG. 8, by switching the multiplexers $7_1$ to $7_4$.

Accordingly, with reference to the output values $x(k)$ of the memory element 2, twenty equidistant intermediate values can be interpolated in an optionally switchable manner. This allows the possibility of fine-tuning of the signal delay produced overall by the signal delaying device 1. In the example shown in FIG. 8, the input signal $S_{in}(k)$ has a sampling rate of 100 MHz, i.e., the sampling period is 10 ns. Accordingly, an unconditioned delay of a multiple of 10 ns is produced by the memory element 2. With the half-band filter 4 and the polyphase filter 5, a fine-tuned delay is additionally possible on a grid of 0.5 ns, thereby considerably increasing the accuracy of the adjustable delay.

The problem upon which the invention is based will now be explained with reference FIGS. 1A to 1C. In each case, the diagram illustrates a number of "original values" $x(k)$ at the output of the memory element 2 and interpolated intermediate values $S_{out}(k)$ produced from these.

FIG. 1A initially illustrates the case of a static delay. One output sampled value $S_{out}(k)$ from the interpolation element 3 corresponds exactly to each output sampled value $x(k)$ of the memory element 2. This case is unproblematic.

Figure 1B:
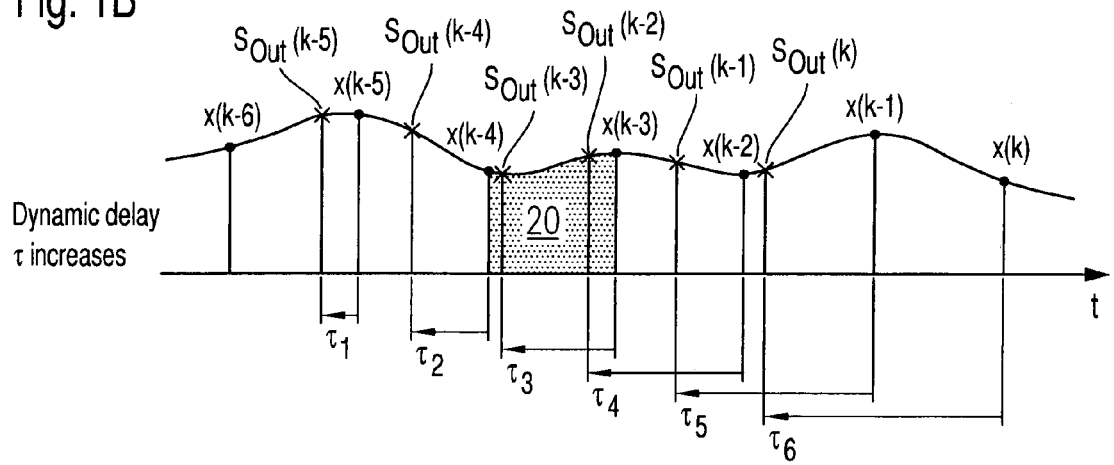
FIG. 1B shows a time line for the visualisation of a dynamic delay with an over-range.

FIG. 1B illustrates a case in which the delay $\tau$ caused by the signal delaying device 1 increases with time t, i.e., the delay intervals $\tau_1$ to $\tau_6$ become increasingly larger. Within the range 20 limited by the output sampled values $x(k-4)$ and $x(k-3)$ of the memory element 2 and shaded in grey in FIG. 1B, there are not only one but, in fact, two output sampled values $S_{out}(k-3)$ and $S_{out}(k-2)$ Within the context of the present application, this case is described as an over-range. This does not represent a particularly difficult problem and can be resolved using a RAM with only one write gate and one read gate in that a new sampled value is indeed stored in the memory element 2, i.e., the write pointer is adjusted, for example, incremented, but no new sampled value $x(k)$ is read out from the memory element 2; in other words, the read pointer is not adjusted. As a result, the half-band filter 4 and the polyphase filter 5 can implement another interpolation with the same output values, but this time at a different interpolation position, that is to say, with a different range, "range 1" and "range 2" from FIG. 8, and/or with a different polyphase $p_0$ to $p_9$. In the case of an over-range, the unconditioned delay of the memory element 2 is increased by one system-clock period.

Figure 1C:
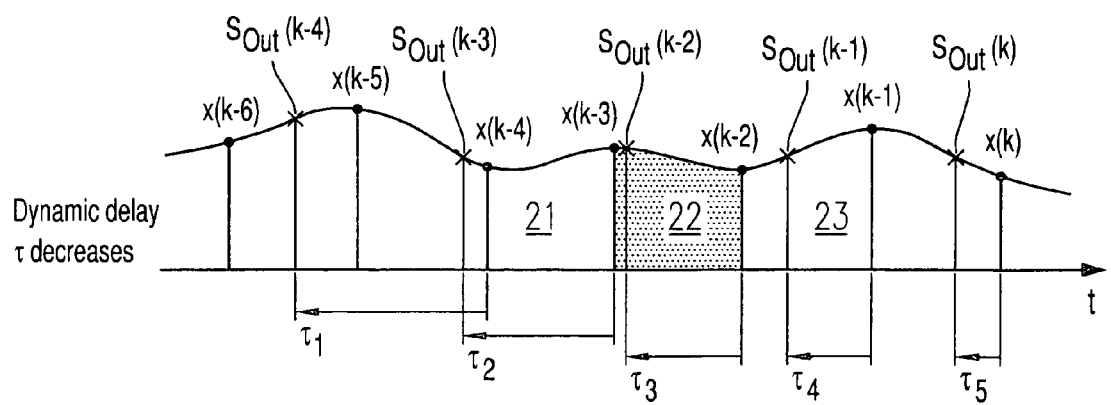
FIG. 1C shows a time line for the visualisation of a dynamic delay with an under-range.

FIG. 1C shows a more complicated case in which the delay $\tau$ produced by the signal delaying device 1 decreases over time t, i.e., the delay intervals $\tau_1$ to $\tau_5$ become progressively smaller. In the example shown in the present case, the interpolation value $S_{out}(k-2)$ does not lie within the range 21, which is limited by the sampled values $x(k-4)$ and $x(k-3)$ at the output of the memory element 2; it lies in the following range 22, which is limited by the sampled values $x(k-3)$ and $x(k-2)$. The calculation of $S_{out}(k-2)$ is therefore based on two new sampled values at the output of the memory element 2. With conventional implementation, this would mean that two output values would have to be read out from the memory element at the same time. This could only be achieved with a relatively expensive RAM with two read gates or alternatively with two RAM memory components arranged in parallel and containing identical information. Both of these solutions would be extremely cost-intensive and are therefore highly disadvantageous.

Figure 2:
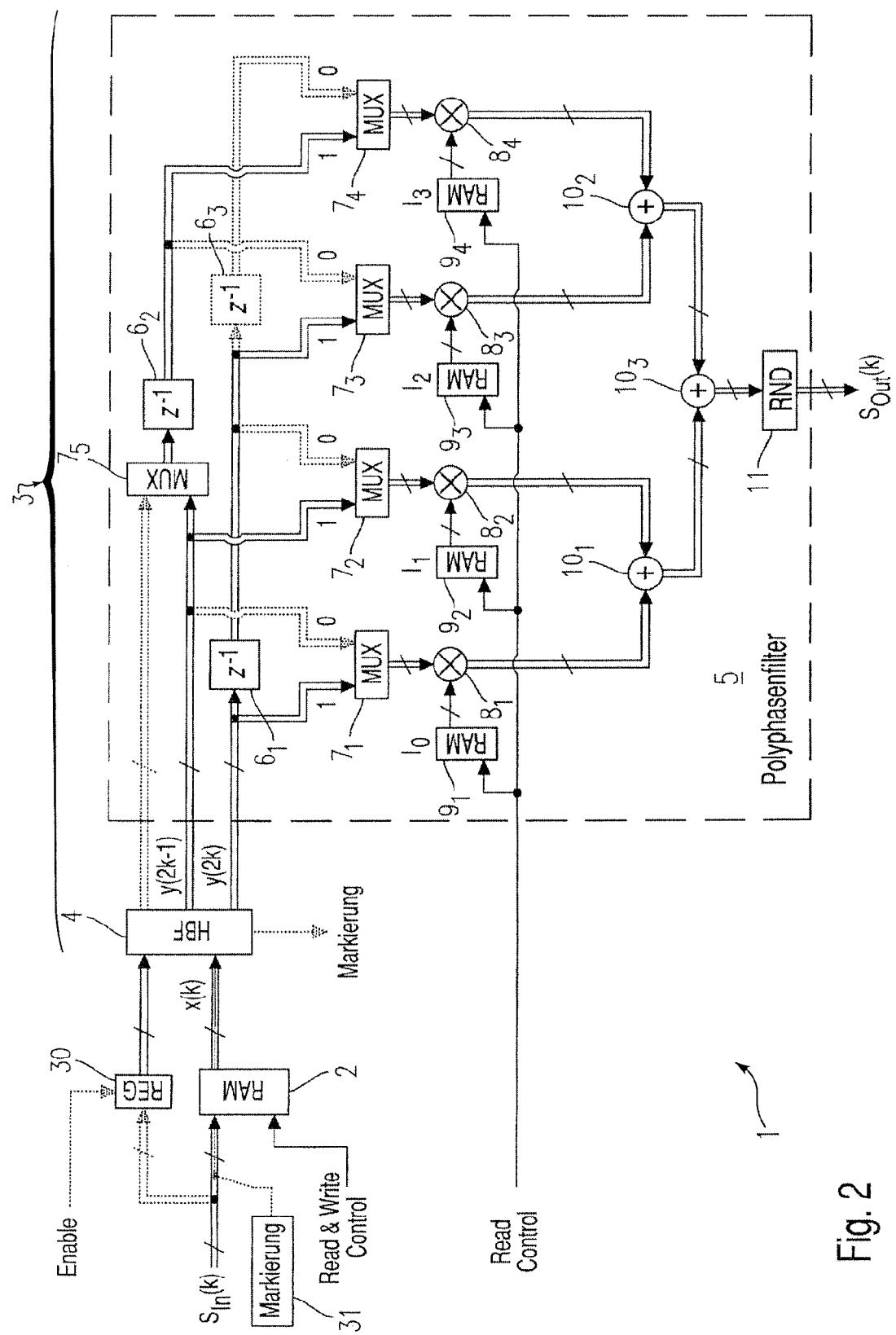
FIG. 2 shows an exemplary embodiment of the signal delaying device according to the invention in a first condition.

In order to resolve this problem, the present invention proposes the arrangement of a register 30, as illustrated in FIG. 2, in parallel to the memory element 2, which, in the presence of a release signal "enable" stores a sampled value $S_{in}(k)$ of the input signal, and that has its output side connected to the input side of the interpolation element 3, in the exemplary embodiment, to the half-band filter 4. Moreover, "range 2" from FIG. 8 is supplemented by the polyphase $p_{10}$.

The collaboration between the register 30, the memory element 2 and the interpolation element 3 will be described below with reference to FIGS. 2 to 6. Different processing conditions are illustrated in each case. Active conductors are shown as continuous lines; non-active conductors are shown as broken lines.

Figure 3:
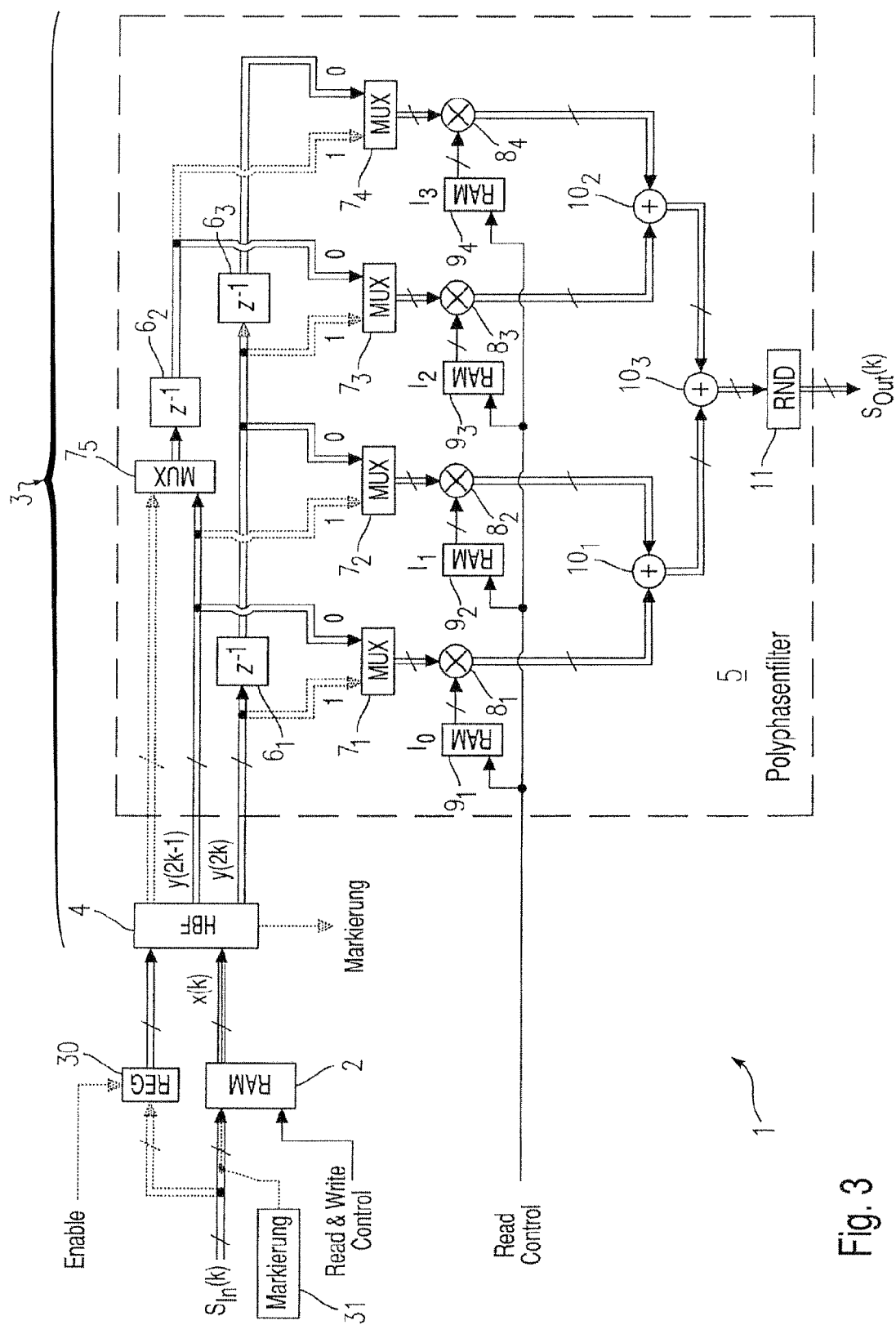
FIG. 3 shows an exemplary embodiment of a signal delaying device according to the invention in a second condition.

FIGS. 2 and 3 initially show the normal operation of the signal delaying device 1 without activation of the register 30. At each system-clock pulse, one sampled value for each digital input signal $S_{in}(k)$ is written into the memory element 2 by the control signal "Read & Write Control", and a sampled value x(k) corresponding to the unconditioned delay is read out. FIGS. 2 and 3 differ from one another in that, in the case of FIG. 2, an interpolation is implemented within "range 1" as shown in FIG. 8; in FIG. 3, an interpolation is implemented within "range 2" from FIG. 8. This is achieved by a corresponding switching of the multiplexers $7_1$ to $7_4$. The multiplexer $7_5$ is connected in both cases in such a manner that uneven output sampled values y(2k−1) can be supplied to the delaying element $6_2$. The required set of coefficients is selected in the memories $9_1$ to $9_4$ with the address "Read Control" to correspond with the desired polyphase. If the range is exceeded as illustrated in FIG. 1B, only one new sampled value $S_{in}(k)$ is written into the memory element 2, but no sampled value x(k) is read out.

Figure 4:
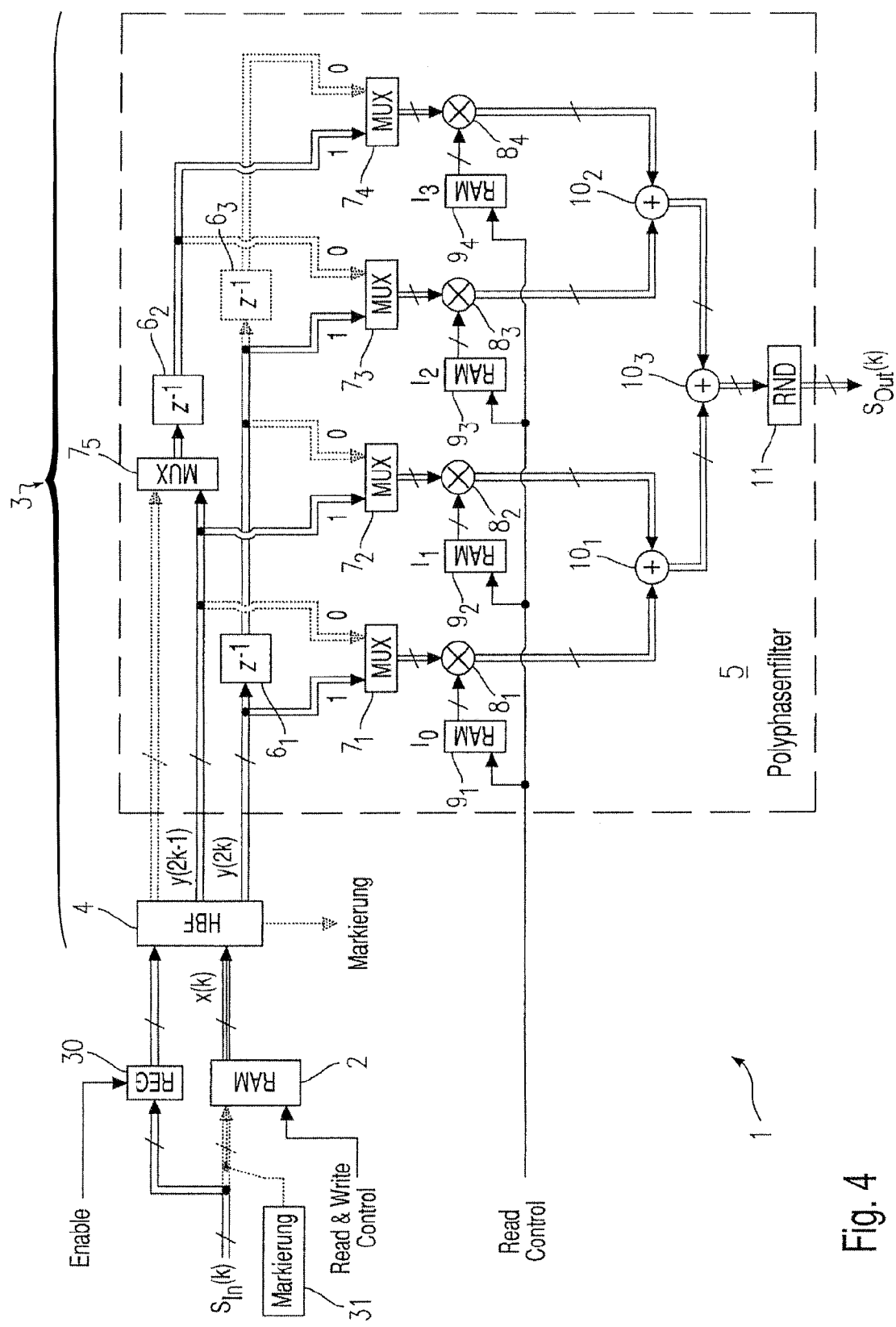
FIG. 4 shows an exemplary embodiment of the signal delaying device according to the invention in a third condition.

When the lower range limit from FIG. 8 is reached at 0 ns, the register 30 is activated by the release signal "Enable", as shown in FIG. 4. At the same time, the write gate of the memory element 2 is deactivated. The next sampled value $S_{in}(k)$ of the input signal is therefore not stored in the memory element 2 but rather in the register 30. Accordingly, the unconditioned delay of the memory element 2 is reduced by one system-clock period. By contrast with the case of an over-range, in this case, the interpolation element 3 is initially not affected by this change, because the change was implemented at the input of the memory element 2 and not at its output.

Figure 5:
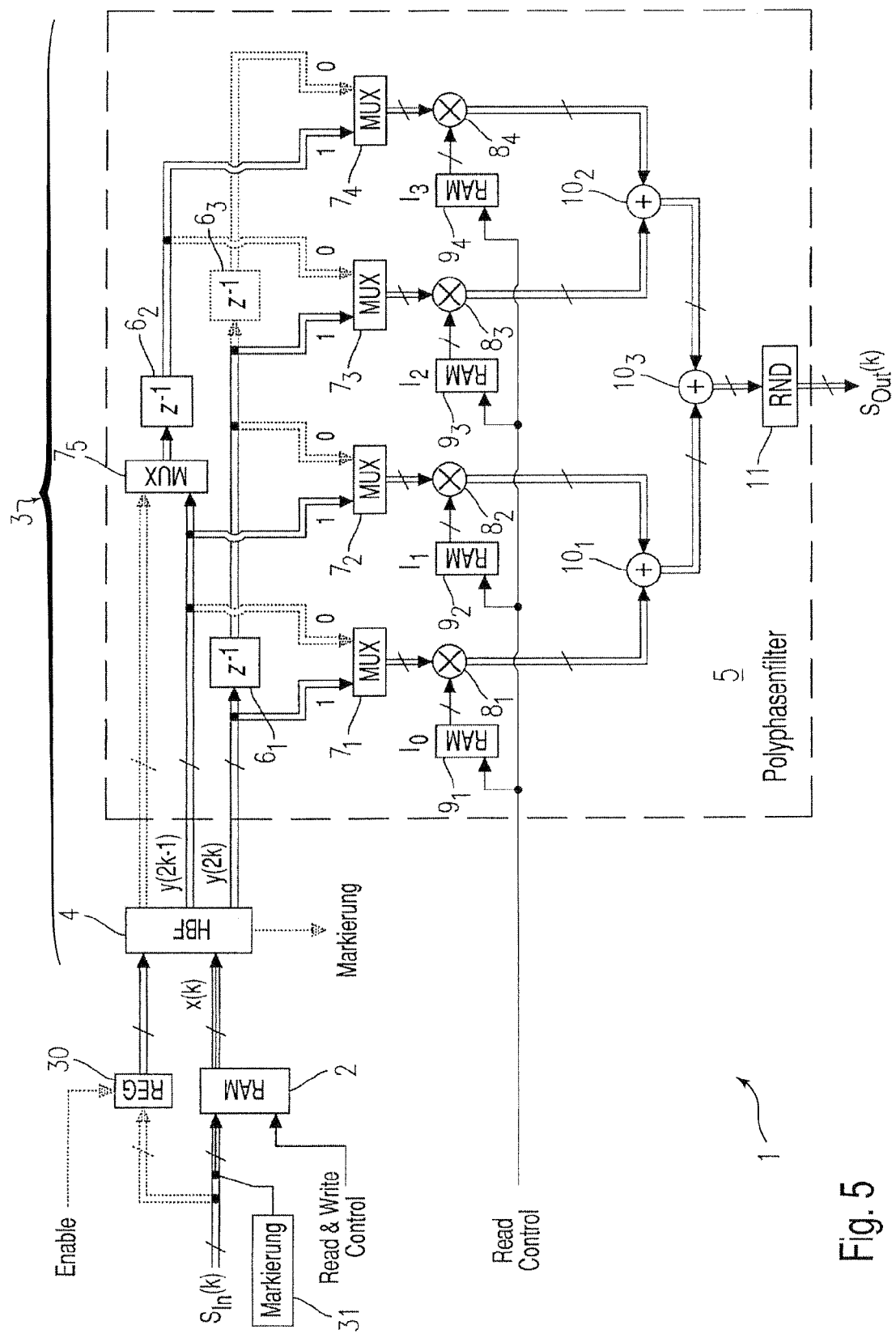
FIG. 5 shows an exemplary embodiment of the signal delaying device according to the invention in a fourth condition.

FIG. 5 shows that in the next system-clock pulse, the next sampled value $S_{in}(k)$ is again stored in the memory element 2, however, this time a marking is added to the sampled value. A marking device 31 is shown symbolically in the present context. The marking device 31 is generally not physically present, but represents a component of the central processor. A bit of the word width of the memory element 2, which is not required for the data word, can be used for marking. The marking runs through the memory element 2 together with the marked sampled value. The interpolation element 3, in the exemplary embodiment, the half-band filter 4, registers when the marking is present at the output of the memory element.

Figure 6:
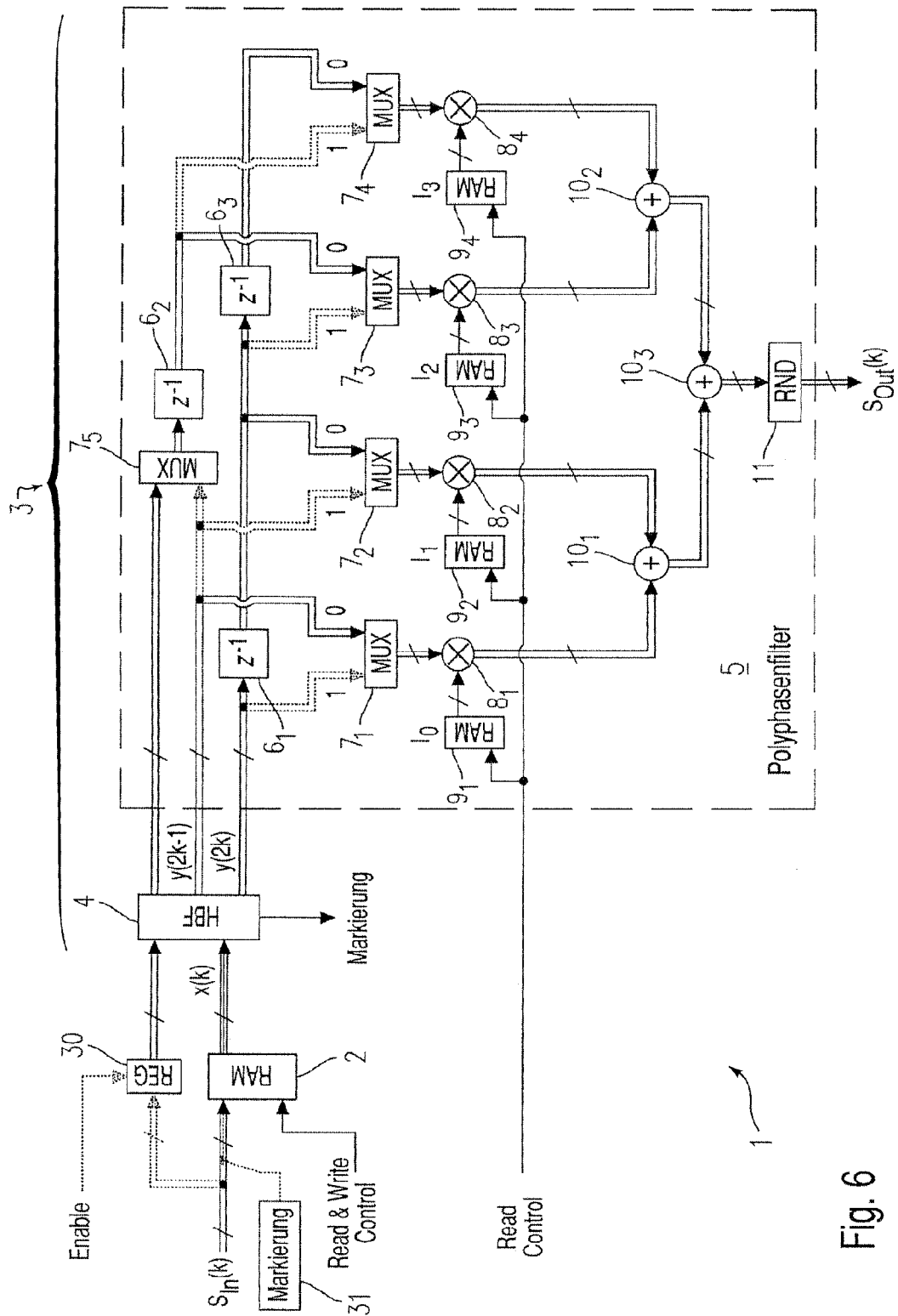
FIG. 6 shows an exemplary embodiment of the signal delaying device according to the invention in a fifth condition.

FIG. 6 illustrates a case in which the marking appears at the output of the memory element 2 and is recognised by the interpolation element 3. In this case, the multiplexer $7_5$ is switched over, and an additional sampled value is produced by the half-band filter 4, which is supplied to the delaying element $6_2$ instead of the uneven sampled value y(2k−1).

The interpolation element 3 therefore carries out an interpolation on the basis of two new input values. One input value was read out from the memory element 2. The other input value was placed in intermediate storage in the register 30 until the occurrence of the marking and then read out from the register.

The simultaneous reading in of two new values into the interpolation element 3, effectively reduces the delay by one system-clock period. However, since an under-range has not so far occurred, but, when the lower range limit is reached, only the possibility of a future under-range is given, the delay must again be compensated by one system-clock period by immediately switching the polyphase from $p_0$ in "range 1" to $p_{10}$ in "range 2". Overall, nothing has yet changed in the delay, but the preparations for an actual under-range, i.e., changing the polyphase from $p_{10}$ to $p_9$ in "range 2" are already complete.

Figure 7:
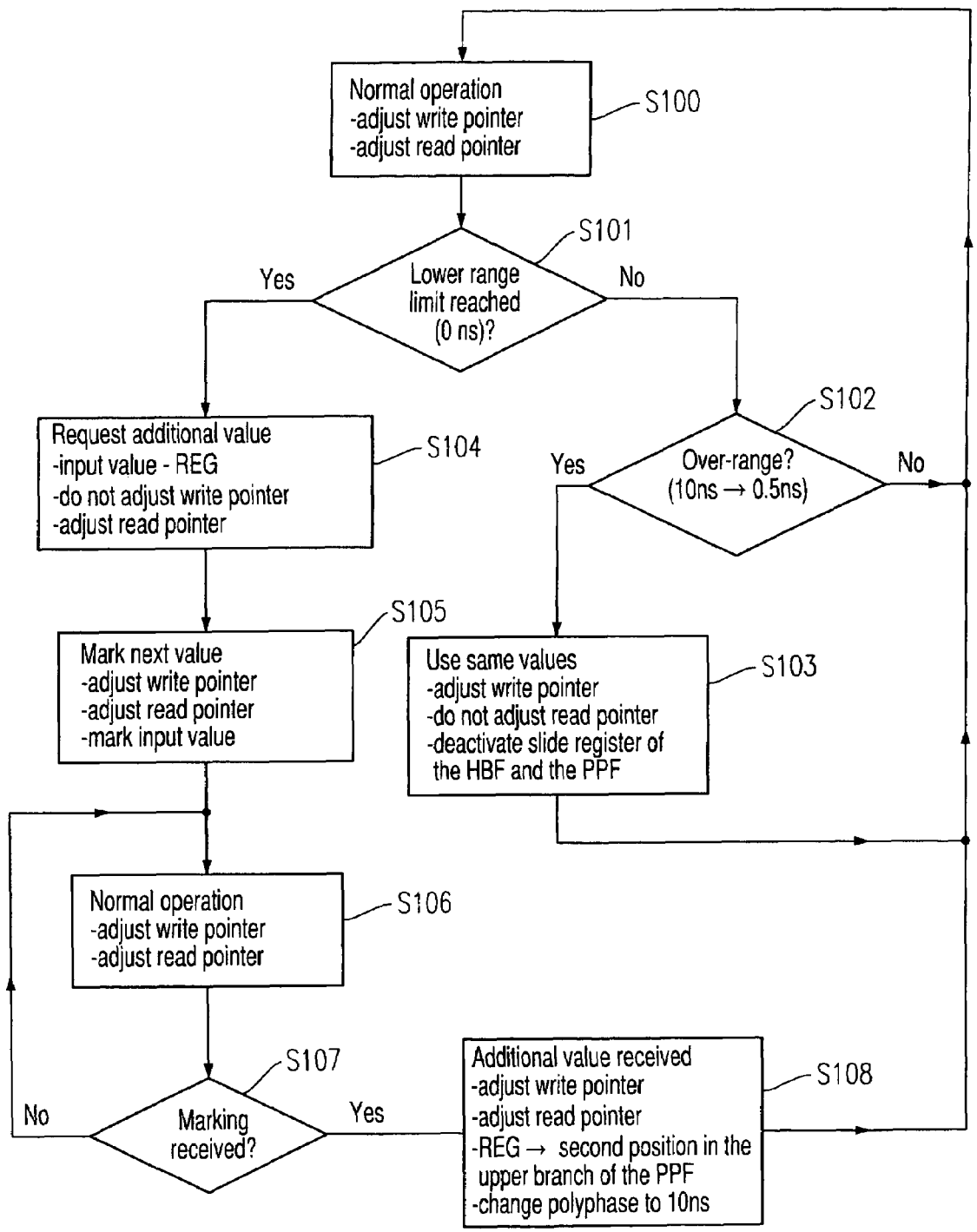
FIG. 7 shows a flow diagram for the explanation of the method according to the invention and FIG. 8 shows a time line for the explanation of the function of the half-band filter and the polyphase filter.

FIG. 7 once again illustrates the method according to the invention with reference to a flow diagram.

Normal operation is illustrated in stage S100, that is to say, at every system-clock pulse, the write pointer, which points to the next memory cell of the memory element 2 to be described below, is adjusted (e.g. incremented). The read pointer is correspondingly adjusted, e.g. incremented to the next memory cell of the memory element 2 to be read out.

In stage S101, a test is run to determine whether the lower range limits, that is, the polyphase $p_0$ in "range 1" from FIG. 8, has been reached. If this is not the case, an under-range as shown in FIG. 1C can be excluded. In stage S102 a check must be carried out to determine whether an over-range has occurred instead, i.e., a change from polyphase $p_{10}$ in "range 2", with an additional delay of 10 ns in this example caused by the interpolation, to polyphase $p_0$ in "range 1" from FIG. 8 with an additional delay of 0.5 ns caused by the interpolation. If this is not the case, then the flow diagram again branches to stage S100.

However, if an over-range is indeed present, only the write pointer, but not the read pointer of the memory element 2 will be adjusted in stage S103. As a result of this measure, the delay caused by the memory element 2 is prolonged.

At the same time, the slide registers of a half-band filter 4 and the delaying elements $6_1$, $6_2$ and $6_3$ of the polyphase filter 5 must be deactivated, so that these do not continue to shift by one clock pulse. After a second interpolation has been carried out in the same range 20 in FIG. 1B with the new polyphase, the flow diagram again branches to stage S100.

By contrast with the above, if it is determined in stage S101 that an under-range is present, then, initially in stage S104, which corresponds to FIG. 4, a sampled value $S_{in}(k)$ is loaded into the register 30 instead of into the memory element 2. In this context, the write pointer of the memory element 2 is naturally not adjusted. However, since a sampled value is read out from the memory element 2 at the same time, the read pointer must be adjusted. As a result of this measure, the delay caused by the memory element 2 is reduced. Stage S104 is represented in FIG. 4.

In stage S105, which corresponds to FIG. 5, in the next system-clock pulse, both the write pointer and the read pointer are adjusted, but the next sampled value to be written into the memory element 2 is provided with a marking.

In stage S106, normal operation is continued until it is determined in stage S107 that the marking has arrived at the output of memory element 2. This means that the additional value stored in the register 30 together with the sampled value x(k) present at the output of the memory element 2 can now be supplied to the delaying element $6_2$ of the polyphase filter 5 via the half-band filter 4 and the multiplexer $7_5$, as illustrated in FIG. 6. The polyphase is changed from 0 ns to 10 ns.

It must still be pointed out that the runtime of the marked sampled value through the memory element 2 is irrelevant, because the system-clock pulse is substantially greater than the time change in the delay time. In other words, for a given polyphase, a large number of sampled values are interpolated, before changing to the next polyphase. Within this time, the marked sampled value will have arrived at the output of the memory element 2 with a high degree of certainty. In FIGS. 1B and 1C, the changes in the delay time are illustrated in an exaggerated manner merely for improved illustration.

The invention is not restricted to the exemplary embodiment presented. For example, as already mentioned, instead of marking, another procedural control could monitor when the sampled value, which follows the sampled value stored in the register 30, has arrived at the output of the memory element 2.

The invention claimed is:

1. Signal delaying device for the dynamic delaying of a digitally sampled input signal with a memory element and a series connected interpolation element, comprising a register that has its output side connected to the input side of the interpolation element for the intermediate storage of at least one sampled value ($S_{in}(k)$) of the input signal and is arranged in parallel to the memory element, and a marking device which, after a sampled value ($S_{in}(k)$) of the input signal has been placed in intermediate storage in the register, adds a marking to the next sampled value ($S_{in}(k+1)$) of the input signal stored in the memory element.

2. Signal delaying device according to claim 1, characterized in that the interpolation element checks whether the marking has arrived at the output of the memory element, and if so, reads out a sampled value (x(k)) from the memory element and also a sampled value from the register.

3. Signal delaying device according to claim 1, wherein the interpolation element comprises a polyphase filter.

4. Signal delaying device according to claim 3, wherein the interpolation element comprises a half-band filter, which is arranged between the memory element and the register on one side, and the polyphase filter on the other side.

5. Method for the dynamic delaying of a digitally sampled input signal with the following procedural stages:
   storing sampled values of the input signal in a memory element,
   reading the sampled values ($S_{in}(k)$) from the memory element,
   interpolating the sampled values (x(k)) read out from the memory element, wherein
   whenever a range defined by two successive sampled values (x(k−4), x(k−3)) is neither undercut nor exceeded in the interpolation, one sampled value ($S_{in}(k)$) is placed into the memory element and one sampled value (x(k)) is read out from the memory element,
   whenever the range defined by two successive sampled values (x(k−4), x(k−3)) is exceeded in the interpolation, no sampled value (x(k)) is read out from the memory element,
   before the range defined by two successive sampled values (x(k−4), x(k−3)) is undercut in the interpolation, placing a sampled value ($S_{in}(k)$) of the input signal in intermediate storage in a register arranged in parallel to the memory element, marking the next sampled value ($S_{in}(k+1)$) of the input signal and storing in the memory element, reading out sampled value(s) from the memory element, and, whenever the marked sampled value arrives at the output of the memory element, reading also the sampled value placed in intermediate storage in the register.

6. Method according to claim 5, wherein the range defined by two successive sampled values (x(k−4), x(k−3)) is exceeded, if at least two interpolation values ($S_{out}(k-3)$, $S_{out}(k-2)$) produced by the interpolation fall within the range of the two successive sampled values.

7. Method according to claim 5 or 6, wherein the range defined by two successive sampled values (x(k−4), x(k−3)) is undercut in the interpolation, if no interpolation value produced by the interpolation falls within the range of the two successive sampled values.

8. Method according to any one of claims 5-6, wherein storage in the memory element takes place by means of a write pointer, and reading out from the memory element takes place by means of a read pointer, wherein the write pointer and the read pointer in each case point towards a given memory cell of the memory element,
   wherein the write pointer and also the read pointer are adjusted if the range defined by two successive sampled values (x(k−4), x(k−3)) is neither undercut nor exceeded in the interpolation.

9. Method according to claim 8, wherein only the write pointer but not the read pointer is adjusted, if the range defined by two successive sampled values (x(k−4), x(k−3)) is exceeded in the interpolation.

10. Method according to claim 8, wherein only the read pointer but not the write pointer is adjusted, if a sampled value is stored in the register.

11. Method according to claim 8, wherein both the write pointer and also the read pointer are adjusted, if a sampled value is read out from the register.

* * * * *

UNITED STATES PATENT AND TRADEMARK OFFICE
CERTIFICATE OF CORRECTION

PATENT NO. : 7,359,469 B2  Page 1 of 1
APPLICATION NO. : 10/761136
DATED : April 15, 2008
INVENTOR(S) : Stephan Neumann et al.

It is certified that error appears in the above-identified patent and that said Letters Patent is hereby corrected as shown below:

| COLUMN | LINE | ERROR |
| --- | --- | --- |
| 8 (Claim 5, | 15 line 24) | after "and storing" insert --it-- |

Signed and Sealed this

Twenty-eighth Day of July, 2009

JOHN DOLL
*Acting Director of the United States Patent and Trademark Office*